(12) United States Patent
Blanco et al.

(10) Patent No.: US 8,692,600 B1
(45) Date of Patent: Apr. 8, 2014

(54) MULTI-PROTOCOL DRIVER SLEW RATE CALIBRATION SYSTEM FOR CALIBRATION SLEW RATE CONTROL SIGNAL VALUES

(71) Applicant: International Business Machines Corporation, Armonk, NY (US)

(72) Inventors: Rafael Blanco, Essex Junction, VT (US); Marcel A. Kossel, Reichenburg (CH); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/737,110

(22) Filed: Jan. 9, 2013

(51) Int. Cl.
*H03K 5/12* (2006.01)
(52) U.S. Cl.
USPC ............................ 327/170; 327/233; 327/234
(58) Field of Classification Search
USPC ..................... 327/170–176, 231, 233–236
See application file for complete search history.

(56) References Cited

U.S. PATENT DOCUMENTS

| | | | |
|---|---|---|---|
| 6,476,654 B2 | 11/2002 | Tanaka | |
| 6,617,895 B2 | 9/2003 | Zumkehr et al. | |
| 6,864,731 B2 | 3/2005 | Zumkehr et al. | |
| 7,046,062 B2 | 5/2006 | Zumkehr et al. | |
| 7,484,064 B2 | 1/2009 | Ware et al. | |
| 8,164,373 B2 * | 4/2012 | Kossel et al. | 327/231 |
| 8,259,888 B2 * | 9/2012 | Hua et al. | 375/375 |
| 8,519,761 B1 * | 8/2013 | Kossel et al. | 327/170 |

* cited by examiner

*Primary Examiner* — An Luu
(74) *Attorney, Agent, or Firm* — Brandon C. Kennedy; H. Daniel Schnurmann; Biggers Kennedy Lenart Spraggins LLP

(57) ABSTRACT

Multi-protocol driver slew rate calibration systems for calibrating slew rate control signal values are provided. Embodiments include generating, by a first phase rotator, a first clock signal; generating, by the second phase rotator, a second clock signal; initially setting, by a calibration controller, phase selector amounts such that the first clock signal is delayed relative to the second clock signal; determining whether the first clock signal is delayed relative to the second clock signal; if the first clock signal is delayed, changing the second phase selector amount; and if the first clock signal is not delayed, using the first clock signal and the second clock signal to calibrate values of control signals provided to control a slew rate of a calibration clock delay line such that the slew rate of the calibration clock delay line substantially matches a target slew rate.

22 Claims, 7 Drawing Sheets

Example Multi-protocol Driver Slew Rate Calibration System 400

MULTI-PROTOCOL DRIVER SLEW RATE CALIBRATION SYSTEM FOR CALIBRATION SLEW RATE CONTROL SIGNAL VALUES

BACKGROUND OF THE INVENTION

1. Field of the Invention

The field of the invention is data processing, or, more specifically, multi-protocol driver slew rate calibration systems for calibrating slew rate control signal values and methods of calibrating slew rate control signal values using multi-protocol driver slew rate calibration systems.

2. Description of Related Art

In order to reduce the size of memory modules, much of the circuitry for controlling the memory modules is offloaded into memory controllers. Given the high clock rates and fast edge speeds utilized in today's systems, timing considerations become challenging and it often the case that timing skews vary greatly from one system implementation to another, especially for systems with larger amounts of memory and a greater overall width of the memory bus.

In order to improve accuracy of timing skew, memory controllers may be configured to calibrate themselves during a power-on initialization sequence in order to adapt to a given system implementation. For example, the circuitry on memory controllers typically used for receiving data from DDR memories normally incorporates features into the physical layer portion (Physical interface) of the memory controller circuit where the controller can adapt to system timing irregularities, this adaptation sometimes being calibrated during a power-on initialization test sequence.

SUMMARY OF THE INVENTION

Multi-protocol driver slew rate calibration systems for calibrating slew rate control signal values are provided. Embodiments include generating, by a first phase rotator, a first clock signal; generating, by the second phase rotator, a second clock signal; initially setting, by a calibration controller, phase selector amounts such that the first clock signal is delayed relative to the second clock signal; determining whether the first clock signal is delayed relative to the second clock signal; if the first clock signal is delayed, changing the second phase selector amount; and if the first clock signal is not delayed, using the first clock signal and the second clock signal to calibrate values of control signals provided to control a slew rate of a calibration clock delay line such that the slew rate of the calibration clock delay line substantially matches a target slew rate.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
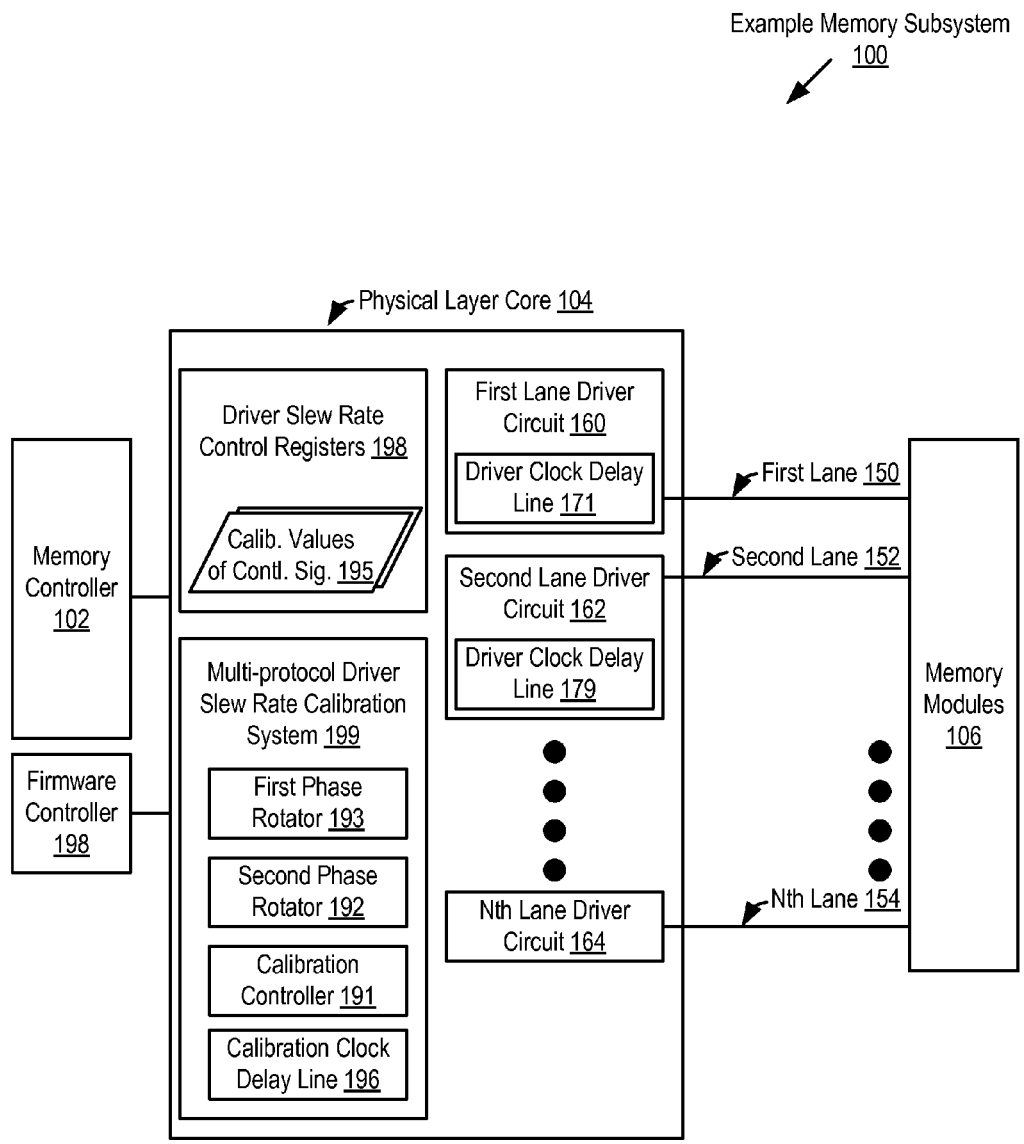
FIG. 1 sets forth a diagram of an example memory subsystem configured to calibrate slew rate control signal values according to embodiments of the present invention.

Exemplary methods and systems for calibrating slew rate control signal values in accordance with the present invention are described with reference to the accompanying drawings, beginning with FIG. 1. FIG. 1 sets forth a diagram of an example memory subsystem (100) configured to calibrate slew rate control signal values according to embodiments of the present invention. In the example of FIG. 1, the memory subsystem (100) of FIG. 1 includes memory modules (106) and a memory controller (102) configured to control and data associated with the memory modules (106). In a particular embodiment, the memory module is a double data rate (DDR) memory and the memory controller is a DDR memory controller. Commands and data from the memory controller (102) are communicated to and from the memory modules (106) via communication lanes. In the example of FIG. 1, the memory module (106) has a first communication lane (150), a second communication lane (152) and an Nth communication lane (154), where N is any number.

The example memory subsystem (100) of FIG. 1 also includes a physical layer core (104), which controls the communication lanes of the memory modules (106) and acts as a physical interface between the memory controller (102) and the memory modules (106). To control the communication lanes, the physical layer core (104) of FIG. 1 employs a plurality of driver circuits. For example, a first lane driver circuit (160) drives the first communication lane (150), a second lane driver circuit (162) drives the second communication lane (152), and an Nth lane driver circuit (164) drives the Nth communication lane (154). Each driver circuit and its associated communication lane may be directed to communicate a particular type of signal. For example, the driver circuits of the physical layer core (104) may be configured for transmitting and receiving a plurality of data signals (DQ), a plurality of data mask signals (DM), and a plurality of data strobe signals (DQS). The physical layer core (104) may be further configured to generate address signals, command signal signals (e.g., CAS, RAS, WE, CS, etc.), and differential clock signals (e.g., CK/CK#).

Each of the lane driver circuits (160, 162, and 164) may include a driver clock delay line for producing a time delayed clock signal that is used by the lane driver circuit to generate an output signal for controlling the communication lane. As will be explained in greater detail below, the slew rate of a driver clock delay line is controlled by control signals provided to the driver clock delay line. The value of the control signals provided to a particular driver clock delay line may be selected based on the type of communication lane coupled to the particular driver clock delay line. That is, a driver clock delay line of a lane driver circuit configured to communicate address (ADR) commands may have a different slew rate than another driver clock delay line of another lane driver circuit configured to communicate DQ signals. As a consequence, at least some driver clock delay lines of the physical layer core (104) may have different associated target slew rates. To configure each driver clock delay line to generate output signals having its particular target slew rate, the physical layer core (104) may utilize a multi-protocol driver slew rate calibration system (199).

The multi-protocol driver slew rate calibration system (199) of FIG. 1 is configured to calibrate values of control signals for a calibration clock delay line (196) such that the calibration clock delay line generates output signals having a slew rate substantially similar to a target slew rate. According to embodiments of the present invention, the calibration clock delay line (196) includes a substantially similar configuration and circuitry as the driver clock delay lines within the lane driver circuits. Because the calibration clock delay line (196) is substantially similar to the driver clock delay lines, the value of the control signals provided to the calibration clock delay line used to generate a particular slew rate may be used to produce the same slew rate in a driver clock delay line.

To calibrate the values of the control signals, according to embodiments of the present invention, the multi-protocol driver slew rate calibration system (199) utilizes a first phase rotator (193), a second phase rotator (192), and a calibration controller (191). Specifically, the first phase rotator (193) is configured to generate a first clock signal by phase rotating an input reference signal by a first phase selector amount and the second phase rotator (192) is configured to generate a second clock signal by phase rotating the input reference signal by a second phase selector amount. A phase rotator is circuitry configured to time shift a clock signal within a clock period. A phase selector amount is a unit of offset or phase delay to be added to the input reference signal. The calibration controller (191) is configured to initially set the first phase selector amount and the second phase selector amount such that the first clock signal is delayed relative to the second clock signal. In a particular embodiment, the first phase selector amount may be zero and the second phase selector amount may be negative. The calibration controller (191) is also configured to determine whether the first clock signal is delayed relative to the second clock signal. If the first clock signal is delayed relative to the second clock signal, the calibration controller (191) is configured to change the second phase selector amount that the second phase rotator uses to phase rotate the input reference signal. If the first clock signal is not delayed relative to the second clock signal, the calibration controller (191) is configured to use the first clock signal and the second clock signal to calibrate values of the control signals provided to control a slew rate of the calibration clock delay line.

In a particular embodiment, the calibration controller (191) uses the first clock signal and the second clock signal to calibrate values by adding the slew target rate to the second clock signal. The calibration controller (191) is also configured to determine whether the second clock signal with the added slew target rate is delayed relative to the output of the calibration clock delay line (196). If the second clock signal with the added slew target rate is delayed relative to the output of the calibration clock delay line (196), the calibration controller (191) is configured to change the values of the control signals provided to the calibration clock delay line (196) to change the slew rate of the calibration clock delay line (196). If the second clock signal with the added slew target rate is not delayed relative to the output of the calibration clock delay line (196), the calibration controller (191) is configured to store the values of the control signals as calibrated values (195) in a slew rate control register (198).

The multi-protocol driver slew rate calibration system (199) may be utilized to generate calibrated values for a variety of driver circuits. For example, the calibration system (199) may generate particular values of control signals for controlling a driver clock delay line (171) of the first lane driver circuit (160) to generate a particular slew rate. Continuing with this example, the calibration system (199) may also generate other values of control signals for controlling another driver clock delay line (179) of the second lane driver circuit (162) to generate another slew rate. That is, the multi-protocol driver slew rate calibration system (199) may be configured to generate different slew rate control signal values for the different lane driver circuits of the physical layer core (104). In a particular embodiment, the multi-protocol slew rate calibration system (199) may be configured to generate these values for the different drivers in a particular order, as will be discussed in greater detail below.

A variety of circuitry and components may be used to implement the memory subsystem of FIG. 1. In one example, the physical layer core (104) and the memory controller (102) may be implemented or instantiated on an application specific integrated circuit (ASIC). According to embodiments of the present invention, the memory subsystem (100) may be comprised of one or more structures including but not limited to high-speed standards-compliant serializer/deserializer (SERDES); high-performance processors and associated systems and reference designs; digital signal processing (DSP) cores; processor peripherals; on-chip bus structures (e.g., AMBA, etc); universal serial bus (USB) cores; memory cores and controllers; ethernet media access controller (MAC) and physical (PHY) cores; and various protocol layer IP (e.g., PCI, Express, XGXS, SPI4-2, etc.).

In a particular embodiment, the physical layer core (104) includes diffused datapath (DP) cores with data lane drivers and ADR cores with ADR drivers. In this embodiment, the physical layer core (104) may include numerous DP cores and at least one ADR core that includes the multi-protocol driver slew rate calibration system (199). As explained above, the driver clock delay lines in the actual DP cores and ADR cores are substantially the same as the calibration clock delay line in the multi-protocol driver slew rate calibration system (199). That is, the loading, wiring, and layout are substantially identical, so results in one core should be identical to the individual drivers, with the exception of any device mismatch impact. In addition, in each DP core, all of the drivers in that core will have an identical set of settings—driver impedance, DRAM load, slew rate, etc., allowing for one calibration for all DP drivers. In the ADR core, a plurality of calibration values may be generated to provide a customer with power optimization. Depending on how many sets of calibration values, the ADR core could require, for example, up to four distinct slew calibrations. Thus, in this example, a total of two-five distinct calibrations maybe be required to properly calibrate all operational modes.

For example, calibrating slew rate control values for the DP drivers and the ADR driver may include a firmware controller (198) enabling clocks into the calibration clock delay line (196) at the start of a calibration process. The second step in the calibration process is to wait one or more cycles (e.g., two thousand cycles) to permit the calibration clock delay line (196) to settle out. Next slew rate control values are calibrated for the DQ/DQS Data Drivers. Immediately afterward, slew rate control values are calibrated for at least one ADR setting. Subsequently, additional slew rate control values may be calibrated for additional ADR settings based on whether the customer is using these settings or not. At the end of calibration, clocks are prevented from entering the calibration clock delay line which saves power during non-calibration times.

Figure 2:
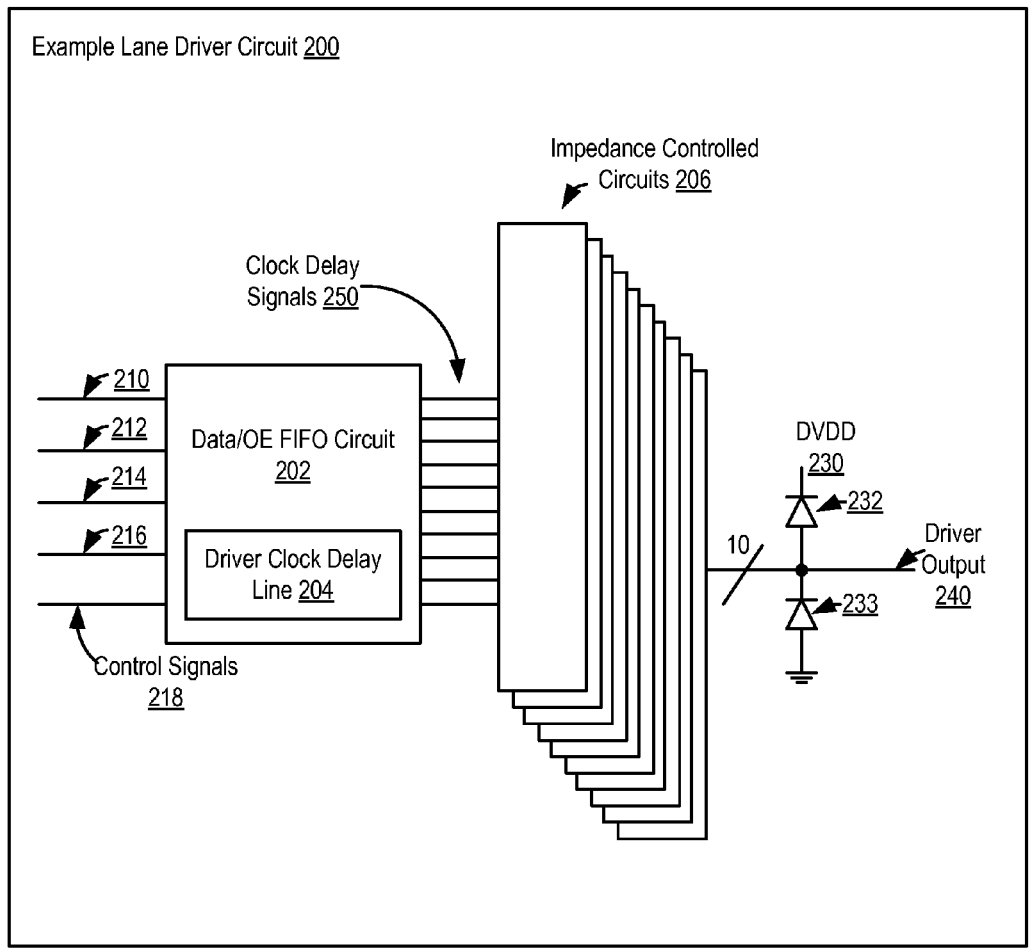
FIG. 2 sets forth a diagram of an example lane driver circuit responsive to slew rate control signal values calibrated according to embodiments of the present invention.

For further explanation, FIG. 2 sets forth a diagram of an example lane driver circuit (200) responsive to slew rate control signal values calibrated according to embodiments of the present invention. As explained above, a lane driver circuit is configured to generate a driver output that 'drives' communication lanes coupling a memory controller to memory modules.

In the example of FIG. 2, the lane driver circuit (200) includes a Data/OE First In First Out (FIFO) circuit (202) and a plurality of impedance controlled circuits (206). The impedance controlled circuits (206) may be considered a collection of 'slices.' In a particular embodiment, each slice is an impedance controlled static CMOS inverter that is tuned to a specific impedance. To provide maximum flexibility, the individual slices may have separate enables (not shown) and the impedance of each slice may be fine-tuned via the sets of PVT (Process/Voltage/Temperature) controls (not shown). Each 'slice' of the impedance controlled circuits (206) is dotted together for generating a driver output (240). In a particular embodiment, the impedance controlled circuits (206) include ten total slices including six Non-FFE slices and four FFE slices, where each slice is fine tuned to an impedance of 480 ohms. Coupled to the impedance controlled circuits (206) is a stacked diode string consisting of an "Up Diode" (232) and a "Down Diode" (233) for protection.

Each of the slices is driven by the outputs of the Data/OE FIFO (202) which generates the full rate output signal (240) for the Non-FFE/FFE slices as well as the controls for Drive High, Drive Low, HiZ, and Thevenin Termination. The Data/OE FIFO (202) may be configured to respond to controls signals. In the example of FIG. 2, the Data/OE FIFO (202) is controlled by a DE/DO signal (212) which indicates half-rate even/odd data to be serialized. The example Data/OE FIFO (202) is also configured to respond to an Output Enable (OE) signal (214), which will drive output to Drive High/Drive Low based on the OE value. In the example of FIG. 2, the Data/OE FIFO (202) is also controlled by a MCTERM signal (216), which indicates whether the driver circuit (200) is in termination mode or drive mode. A clock signal (210) is also provided to the Data/OE FIFO circuit (202), which is a half rate clock which drives output serialization.

The Data/OE FIFO (202) also includes a driver clock delay line (204) that is responsive to control signals (218) received by the Data/OE FIFO (202). The driver clock delay line (204) is configured to generate a clock delay signal (250) for each slice of the impedance controlled circuits (206). Values of the control signals (218) determine the rise/fall times of the clock delay signals (250) generated by the clock delay line (204) and provided to the impedance controlled circuits (206). Specifically, the clock delay line (204) may implement a clock feathering process which produces a sequence of controls in such a way that the Non-FFE and FFE slices get time skewed data which will produce a variable rise/fall transition. The rate of the change of the driver output (240) is a function of the amount of delay differences between adjacent slices.

Figure 3:
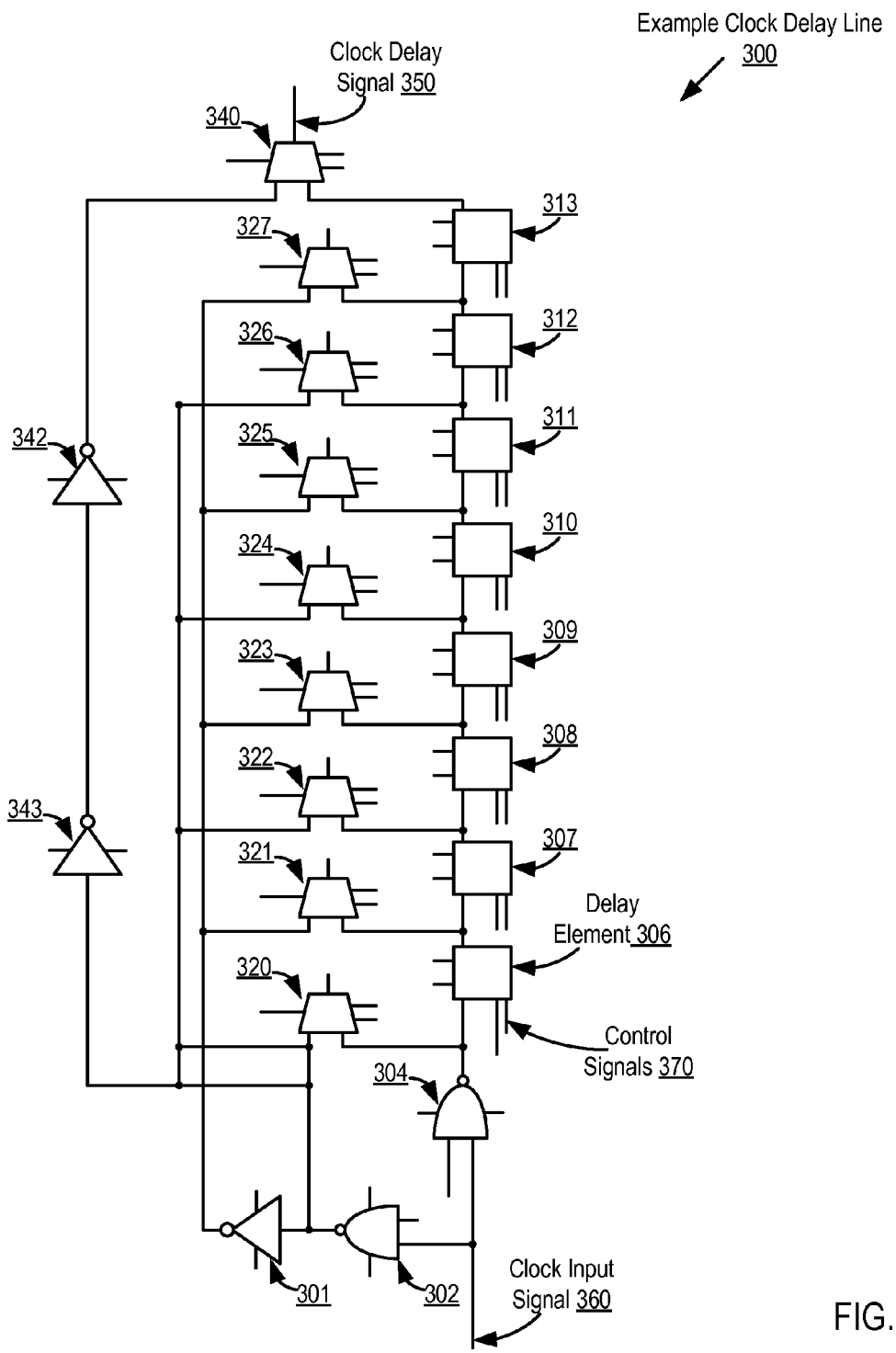
FIG. 3 sets forth a diagram of an example clock delay line responsive to slew rate control signal values calibrated according to embodiments of the present invention.

For further explanation, FIG. 3 sets forth a diagram of an example clock delay line (300) responsive to slew rate control signal values calibrated according to embodiments of the present invention. As explained above, a clock delay line is configured to generate clock delay signals to provide to impedance controlled circuits of a lane driver circuit. A clock delay line may generate clock delay signals using delay stages. In the example of FIG. 3, the clock delay line (300) include eight delay stages plus one additional stage (340) used for the clock delay signal (350) sent to the Data/OE FIFO logic. The additional stage (340) is coupled to a chain of inverters (342, 343). An input clock signal (360) comes into the beginning of the delay line (300) and propagates down the lower delay chain hitting the disable NAND (304) and eight binary weighted delay elements (306-313).

The clock delay line (300) of FIG. 3 is configured to operate in two modes—bypass mode and delay control mode. In the bypass mode, a multiplexer (320) at the output of the delay line selects the early clock at output of a disable NAND (302) and the compliment from an inverter (301) so that each of the clock outputs have the same timing and that is based on the earliest clock signal. This will produce the fastest output slew rate as all eight clocks essentially fire at the same time. In the delay control mode, all of the multiplexers (320-327) select the successive delayed outputs in the delay line which produces a cascade of clock pulses.

Delay elements may be implemented using a variety of circuitry for generating a delay. For example, the delay elements may be static CMOS gated inverters arranged in a stack whose output "dots" with other delay elements. Each of the delay elements may be controlled by a different control signal (370). In the example of FIG. 3, the strength of the CMOS inverters in the clock delay line grows with the number of delay elements turned on, which in turn reduces the delay of the path. For example, four binary values of the control signals (370) may enable sixteen slew rate settings for the clock delay line (300).

Figure 4:
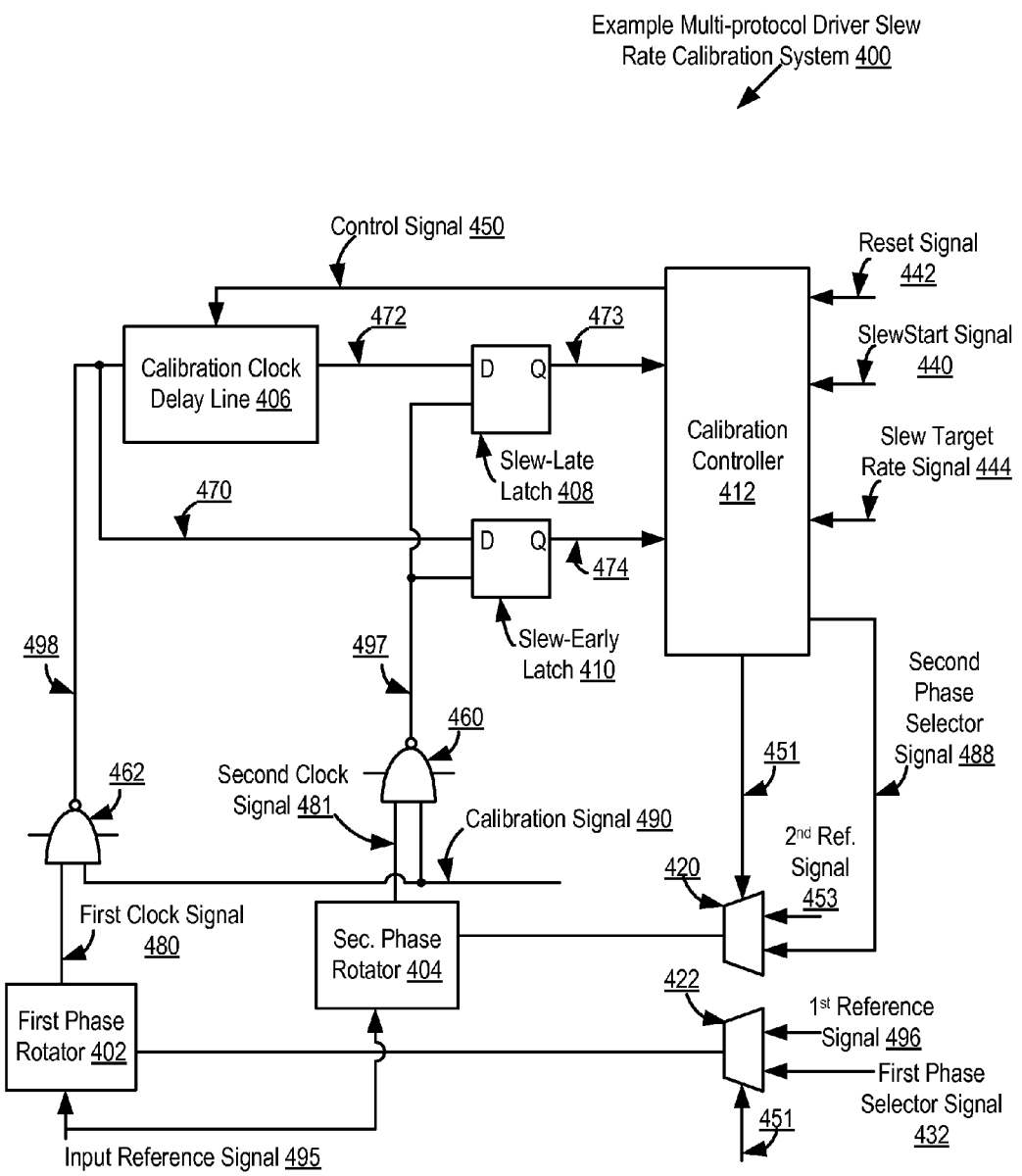
FIG. 4 sets forth a diagram of an example multi-protocol driver slew rate calibration system for calibrating slew rate control signal values according to embodiments of the present invention.

For further explanation, FIG. 4 sets forth a diagram of an example multi-protocol driver slew rate calibration system (400) for calibrating slew rate control signal values according to embodiments of the present invention. The multi-protocol driver slew rate calibration system (400) of FIG. 4 is configured to calibrate values of control signals (450) for a calibration clock delay line (406) such that the calibration clock delay line (406) generates output signals (472) having a slew rate substantially similar to a target slew rate. According to embodiments of the present invention, the calibration clock delay line (400) includes a substantially similar configuration and circuitry as the driver clock delay lines within lane driver circuits, such as in FIGS. 1-3. Because the calibration clock delay line (400) is substantially similar to the driver clock delay lines, the value of the control signals provided to the calibration clock delay line (400) used to generate a particular slew rate may be used to produce the same slew rate in a driver clock delay line.

To calibrate the values of the control signals (450), according to embodiments of the present invention, the multi-protocol driver slew rate calibration system (400) utilizes a first phase rotator (402), a second phase rotator (404), and a calibration controller (412). Specifically, the first phase rotator (402) is configured to generate a first clock signal (480) by phase rotating an input reference signal (495) by a first phase selector amount and the second phase rotator (404) is configured to generate a second clock signal (481) by phase rotating the input reference signal (495) by a second phase selector amount. Essentially, the phase rotators break up a clock period in equally spaced steps. The first phase selector amount is indicated to the first phase rotator (402) by a first phase selector signal (432) provided by the calibration controller (412) via a first multiplexer (422). Likewise, the second phase selector amount is indicated to the second phase rotator (404) by a second phase selector signal (488) provided by the calibration controller (412) via a second multiplexer (420).

In order to save power in the slew calibration system, the multi-protocol driver slew rate calibration system (400) also includes first comparator circuitry (462) coupled between an output of the first phase rotator (402) and an input (498) of the clock delay line (406). The multi-protocol driver slew rate calibration system (400) also includes second comparator circuitry (460) coupled between an output of the second phase rotator (404) and the clock input (497) of a slew-late latch (408) and a slew-early latch (410). In the example of FIG. 4, the first comparator circuitry (462) and the second comparator circuitry (460) are each configured to switch between a power saving mode and a calibration mode in response to receiving a calibration signal (490).

The calibration controller (412) is configured to control the calibration process in response to receiving input signals from a firmware controller, such as the firmware controller (198) in FIG. 1. In the example of FIG. 4, the calibration controller (412) may receive a reset signal (442), a slew start signal (440), and a slew target rate signal (444). The reset signal (442) may be used to control initialization and the slew start signal (440) may be used to indicate to start calibration on rising edge of next signal input. The slew target rate signal (444) may indicate the desired target slew rate for calibration of the control signal values.

During the calibration mode, the calibration controller (412) provides a calibration selection signal (451) to the first multiplexer (422) and the second multiplexer (420) as well as the first phase selector signal (432) and the second phase selector signal (488). In response to receiving the calibration selection signal (451), the first multiplexer (422) provides the first phase selector signal (432) to the first phase rotator (402) and the second multiplexer (420) provides the second phase selector signal (488) to the second phase rotator (404). As explained above, the phase selector signals indicate phase selector amounts for the phase rotator to phase shift the input reference signal (495). During non-calibration mode operation, the first multiplexer (420) is configured to provide a first reference signal (496) to the first phase rotator (402) and the second multiplexer (422) is configured to provide a second reference signal (453) to the second phase rotator (404).

During the calibration mode, the calibration controller (412) is also configured to initially set the first phase selector amount (via the first phase selector signal (432) and the second phase selector amount (via the second phase selector signal (488) such that the first clock signal (480) is delayed relative to the second clock signal (481). After initially setting the phase selector amounts, the calibration controller (412) is configured to determine whether the first clock signal (480) is delayed relative to the second clock signal (481). As part of this determination, the multi-protocol driver slew rate calibration system (400) also includes a slew-early latch (410) having an input coupled to an input (470) of the calibration clock delay line (406) and having an output coupled to a first input (474) of the calibration controller (412). In the example of FIG. 4, the slew-early latch (410) also includes a clock input (497) configured to receive the second clock signal (481). The calibration controller (412) may be configured to determine whether the first clock signal (480) is delayed relative to the second clock signal (481) by monitoring the output of the slew-early latch (410) for a state change.

If the first clock signal (480) is delayed relative to the second clock signal (481), the calibration controller (412) is configured to change the second phase selector amount that the second phase rotator (404) uses to phase rotate the input reference signal (495). If the first clock signal (480) is not delayed relative to the second clock signal (481), the calibration controller (412) is configured to use the first clock signal (480) and the second clock signal (481) to calibrate values of the control signals (450) provided to control a slew rate of the calibration clock delay line (406).

In a particular embodiment, the calibration controller (412) uses the first clock signal (480) and the second clock signal (481) to calibrate slew rate control signal values by adding the slew target rate to the second clock signal (481). The calibration controller (412) is also configured to determine whether the second clock signal (481) with the added slew target rate is delayed relative to the output of the calibration clock delay line (406). As part of this determination, the multi-protocol driver slew rate calibration system (400) also includes a slew-late latch (408) having an input coupled to an output (472) of the clock delay line (406) and having an output coupled to a second input (473) of the calibration controller (412). In the example of FIG. 4, the slew-late latch (408) also includes the clock input (497) configured to receive the second clock signal (481). The calibration controller (412) may be configured to determine whether the second clock signal (481) with the added slew target rate is delayed relative to the output of the calibration clock delay line by monitoring the output of the slew-late latch (408) for a state change.

If the second clock signal (481) with the added slew target rate is delayed relative to the output of the calibration clock delay line (406), the calibration controller (412) is configured to change the values of the control signals (450) provided to the calibration clock delay line (406) to change the slew rate (amount of delay) of the calibration clock delay line (406). If the second clock signal (481) with the added slew target rate is not delayed relative to the output of the calibration clock delay line (406), the calibration controller (412) is configured to store the values of the control signals (450) as calibrated values in a slew rate control register.

The multi-protocol driver slew rate calibration system (400) may be utilized to generate calibrated values for a variety of driver circuits. For example, the calibration system (400) may generate particular values of control signal for controlling a driver clock delay line of a first lane driver circuit to generate a particular slew rate. Continuing with this example, the calibration system (400) may also generate other values of control signals for controlling another driver clock delay line of a second lane driver circuit to generate another slew rate. That is, the multi-protocol driver slew rate calibration system (400) may be configured to generate different slew rate control signal values for the different lane driver circuits of a physical layer core.

For example, a calibration process may start with a customer defining a set of parameters associated with slew rate control including DVDD voltage, Drive Impedance, DRAM termination impedance, and Data Rate. These parameters are used to specify values for a lookup process to determine the target slew rate. As described above, this value provides the timing reference to calibrate against. Next the slew start signal (440) is set and the calibration process begins. The user may poll the slew start signal which ends up being set to zero when the calibration process is complete. Once the slew start signal is zero, the user can read the control signals (450) and then optionally write values of the controls signals into a DP register or an appropriate (0-3) ADR setting field based on which core is being calibrated.

Figure 5:
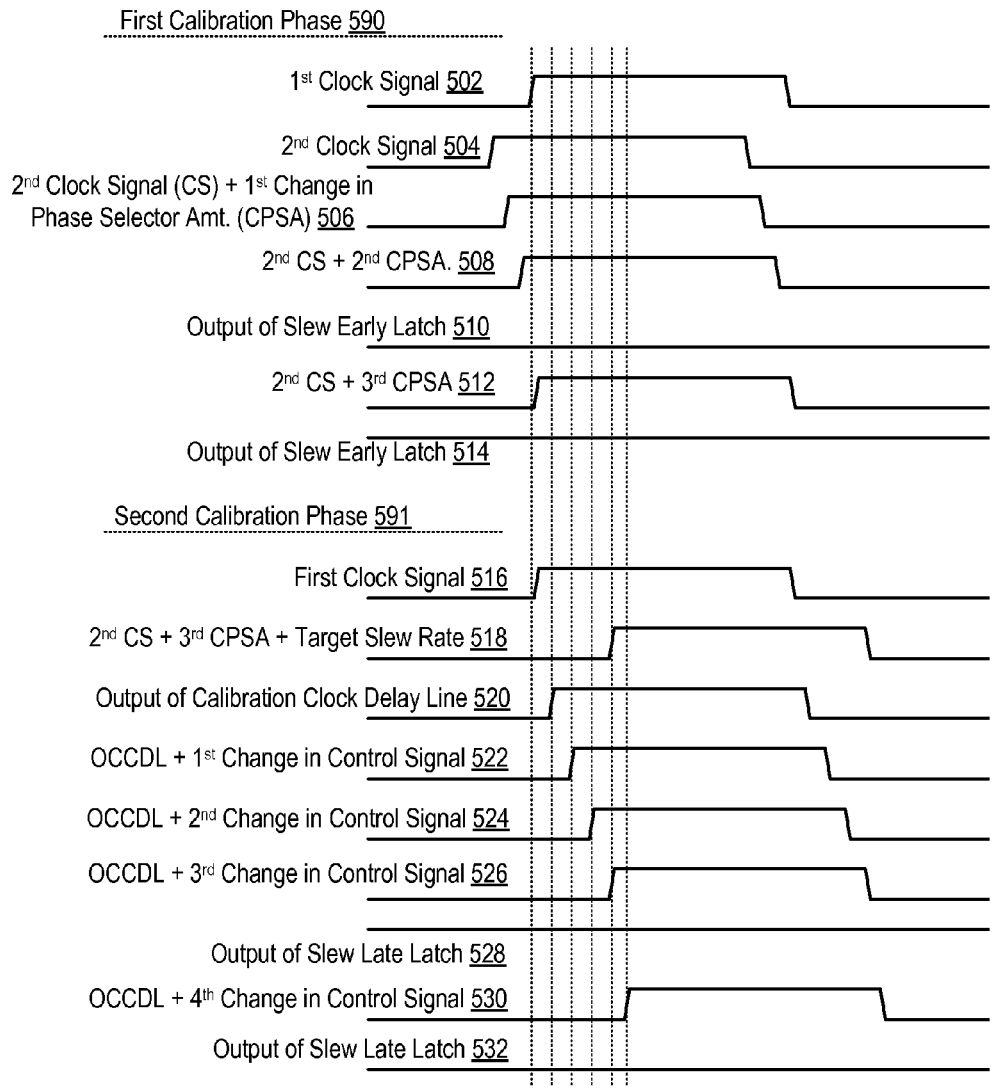
FIG. 5 sets forth a timing diagram of signals generated by an example multi-protocol driver slew rate calibration system during calibration of slew rate control signal values according to embodiments of the present invention.

For further explanation, FIG. 5 sets forth an example timing diagram of signals generated by the example multi-protocol driver slew rate calibration system (400) of FIG. 4 during calibration of slew rate control signal values according to embodiments of the present invention. In the example of FIG. 5, the calibration process is broken into a first calibration phase (590) and a second calibration phase (591). The first calibration phase (590) is designed to compensate for the first clock offset to the input of the delay line (406) as seen by the slew-early latch (410) of FIG. 4. The second calibration phase (591) actually performs the calibration of the calibration clock delay line (406) once the first clock signal latch skew is determined and nullified.

The first calibration phase (590) begins with the first clock signal (502) being set to 'zero' value. As explained above, the first calibration phase (590) is designed to remove clock skew between the first clock signal and the second clock signal as well as the setup time of the slew-early latch (410) and the slew-late latch (408). Because this skew might be negative, the first calibration phase (590) includes placing a two's complement (negative) delay on the second phase rotator (404). For example, a nominal value of 0.25 UI may be used to assure the skew can be nulled out. At this point, the slew-early latch (410) should be at a static zero level (510) since the data input to the slew-early latch (410) is sampling the low signal of the first clock signal. The calibration controller (412) begins incrementing the delay provided by the second phase rotator (404) by adding incremental phase selector amounts to the second clock signal (e.g., the second clock signal with the first additional phase selector amount (506) and the second clock signal with the second additional phase selector amount (508). In response to adding a third additional phase selector amount to the second clock signal (512), the second clock signal passes the first clock signal into the slew-early latch (410) and the output captures the logic one as shown in the output (514) of the slew early latch (410). At this point the transition of the output (514) of the slew early latch (410) from zero to one indicates the skew between the first clock signal and the second clock signal has been compensated and the algorithm proceeds to the second calibration phase (591).

The second calibration phase (591) begins with providing the value of the control signals to the calibration clock delay line such that the calibration clock delay line generates a fast slew with minimum delay setting. As explained above, the amount of delay is indicated to the calibration controller (412) via the slew target signal (440) in phase rotator steps. This spacing is show in FIG. 5 as the difference between the first clock signal (516) and the second clock signal rotated with the third additional phase selector amount and the added target slew rate (518). The second calibration phase (591) is designed to change the values of the control signal (450) until the second clock signal rotated with the third additional phase selector amount and the slew target rate is not delayed relative to the output of the calibration clock delay line. Providing the target slew rate is greater in delay than the minimum delay of the clock delay line, the output (528) of the slew-late latch (408) will be at a static one level. The calibration process continues by changing the slew rate control signal values which changes the output of the calibration clock delay line. For example, a first change in the slew rate control signal values changes the output (522) of the calibration clock delay line, a second change in the slew rate control signal values changes the output (524) of the calibration clock delay line, and a third change in the slew rate control signal values changes the output (526) of the calibration clock delay line. In these examples, because the second clock signal rotated with the third additional phase selector amount and the slew target rate is delayed relative to the output of the calibration clock delay line, the output (528) of the slew-late latch (408) is still high. Eventually, in this example when a fourth change in the value of the control signals generates an output (530) of the calibration clock delay line, the output (532) of the slew-late latch (408) drops from logic one to logic zero. At this point the calibration is complete and the calibration controller (412) then reports the value of control signals required to just travel from logic one to zero.

Figure 6:
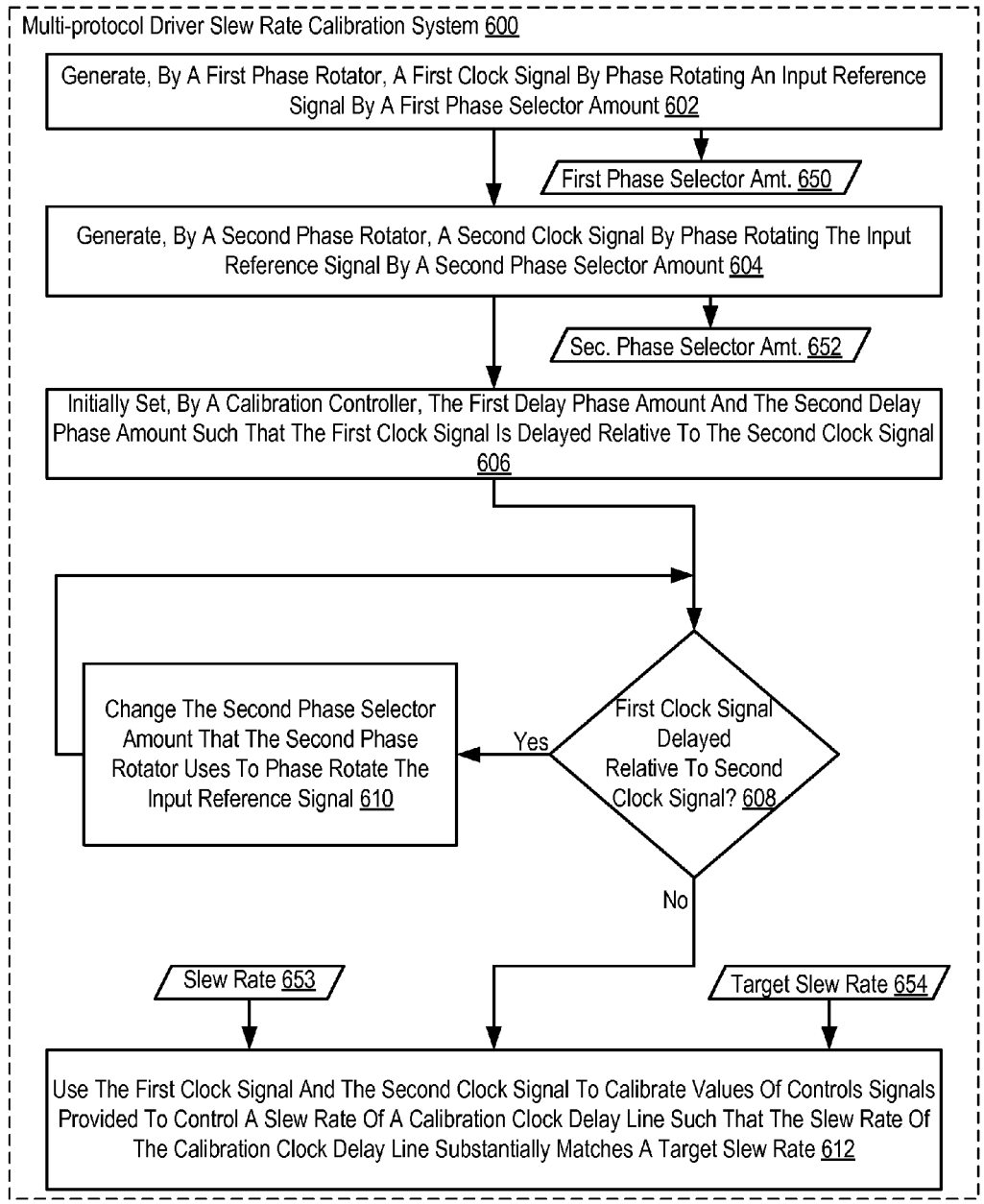
FIG. 6 sets forth a flow chart illustrating an exemplary method for calibrating a slew rate of a multi-protocol driver slew rate calibration system according to embodiments of the present invention.

For further explanation, FIG. 6 sets forth a flow chart illustrating an exemplary method for calibrating a slew rate of a multi-protocol driver slew rate calibration system according to embodiments of the present invention. For ease of explanation, the circuitry and components of FIGS. 1-5 are referenced with the description of the method of FIG. 6.

The method of FIG. 6 includes generating (602), by the first phase rotator (402), a first clock signal (480) by phase rotating the input reference signal (495) by a first phase selector amount (650). Generating (602), by the first phase rotator (402), a first clock signal (480) by phase rotating the input reference signal (495) by a first phase selector amount (650) may be carried out by breaking up the first reference signal into phase steps and rotating the first reference signal by a particular number of phase steps in response to receiving a control signal from the calibration controller.

The method of FIG. 6 also includes generating (604), by the second phase rotator (404), a second clock signal (481) by phase rotating the input reference signal (495) by a second phase selector amount (652). Generating (604), by the second phase rotator (404), a second clock signal (481) by phase rotating the input reference signal (495) by a second phase selector amount (652) may be carried out by breaking up the input reference signal into phase steps and rotating the input reference signal by a particular number of phase steps in response to receiving a control signal from the calibration controller.

The method of FIG. 6 also includes initially setting (606), by the calibration controller (412), the first phase selector amount (650) and the second phase selector amount (652) such that the first clock signal (480) is delayed relative to the second clock signal (481). Initially setting (606), by the calibration controller (412), the first phase selector amount (650) and the second phase selector amount (652) may be carried out by transmitting the calibration control signal (451) to the first multiplexer (422) and the second multiplexer (420); transmitting the first phase selector signal (432) and the second phase selector signal (488); and transmitting, by the multiplexers, the phase selector signals to the phase rotators.

The method of FIG. 6 also includes determining (608), by the calibration controller (412), whether the first clock signal (480) is delayed relative to the second clock signal (481). Determining (608), by the calibration controller (412), whether the first clock signal (480) is delayed relative to the second clock signal (481) may be carried out by examining the output of a slew-early latch.

If the first clock signal (480) is delayed relative to the second clock signal (481), the method of FIG. 6 continues by changing (610), by the calibration controller (412), the second phase selector amount (652) that the second phase rotator (404) uses to phase rotate the input reference signal (495). Changing (610), by the calibration controller (412), the second phase selector amount (652) that the second phase rotator (404) uses to phase rotate the input reference signal (495) may be carried out by instructing the second phase rotator to change the amount of delay added to the second clock signal.

If the first clock signal (480) is not delayed relative to the second clock signal (481), the method of FIG. 6 continues by using (612), by the calibration controller (412), the first clock signal (480) and the second clock signal (481) to calibrate values of control signals (450) provided to control a slew rate (653) of a calibration clock delay line (406) such that the slew rate (653) of the calibration clock delay line (406) substantially matches a target slew rate (654).

Figure 7:
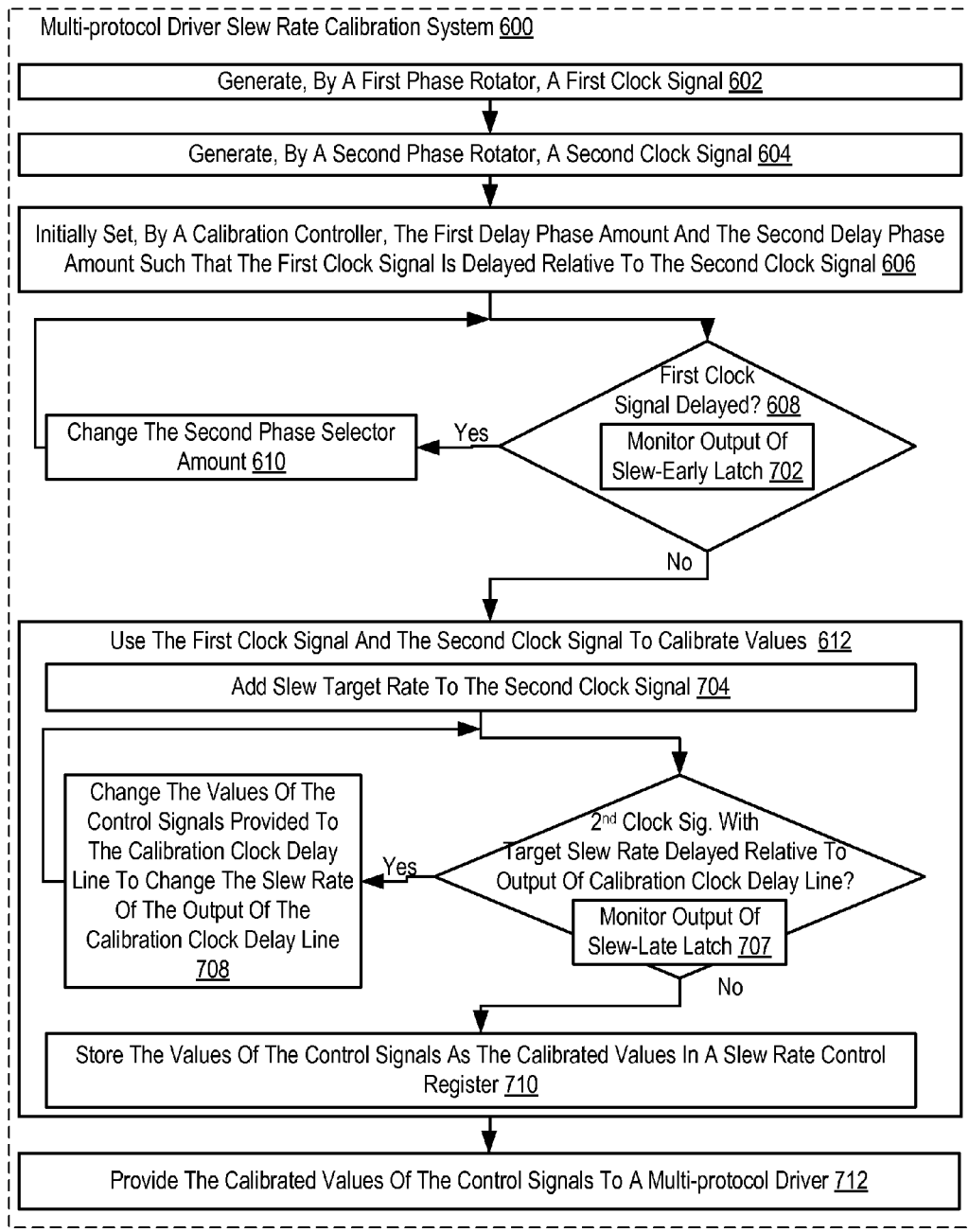
FIG. 7 sets forth a flow chart illustrating another exemplary method for calibrating a slew rate of a multi-protocol driver slew rate calibration system according to embodiments of the present invention.

For further explanation, FIG. 7 sets forth a flow chart illustrating another exemplary method for calibrating a slew rate of a multi-protocol driver slew rate calibration system according to embodiments of the present invention. The method of FIG. 7 is similar to the method of FIG. 6 in that the method of FIG. 7 also includes generating (602) a first clock signal (480) by phase rotating an input reference signal (495) by a first phase selector amount (650); generating (604) a second clock signal (481) by phase rotating the input reference signal (495) by a second phase selector amount (652); initially setting (606) the first phase selector amount (650) and the second phase selector amount (652) such that the first clock signal (480) is delayed relative to the second clock signal (481); determining (608) whether the first clock signal (480) is delayed relative to the second clock signal (481); if the first clock signal (480) is delayed relative to the second clock signal (481), changing (610) the second phase amount (652) that the second phase rotator (404) uses to phase rotate the input reference signal (495); if the first clock signal (480) is not delayed relative to the second clock signal (481), using (612) the first clock signal (480) and the second clock signal (481) to calibrate values of control signals (450) provided to control a slew rate (653) of a calibration clock delay line (406) such that the slew rate (653) of the calibration clock delay line (406) substantially matches a target slew rate (654).

In the method of FIG. 7, however, determining (608), by the calibration controller (412), whether the first clock signal (480) is delayed relative to the second clock signal (481) includes monitoring (702) the output of the slew-early latch (410). Monitoring (702) the output of the slew-early latch (410) may be carried out by detecting a state change at the output of the slew-early latch.

In the method of FIG. 7, however, using (612), by the calibration controller (412), the first clock signal (480) and the second clock signal (481) to calibrate values of control signals (450) includes adding (704), by the calibration controller (412), the slew target rate (654) to the second clock signal (481). Adding (704), by the calibration controller (412), the slew target rate (654) to the second clock signal (481) may be carried out by increasing the delay of the second clock signal by a particular number of phase steps indicated by the target slew rate.

In the method of FIG. 7, however, using (612), by the calibration controller (412), the first clock signal (480) and the second clock signal (481) to calibrate values of control signals (450) includes determining (706), by the calibration controller (412), whether the second clock signal (481) with the added slew target rate (654) is delayed relative to the output of the calibration clock delay line (406). Determining (706), by the calibration controller (412), whether the second clock signal (481) with the added slew target rate (654) is delayed relative to the output of the calibration clock delay line (406) may be carried out by monitoring (708) the output of the slew-late latch (408) for a state change.

If the second clock signal (481) with the added slew target rate (654) is delayed relative to the output of the calibration clock delay line (406), the method of FIG. 7 continues by changing (708), by the calibration controller (412), the values of the control signals provided to the calibration clock delay line (406) to change the slew rate of the output of the calibration clock delay line (406). Changing (708), by the calibration controller (412), the values of the control signals provided to the calibration clock delay line (406) to change the slew rate of the output of the calibration clock delay line (406) may be carried out by increasing or decreasing the value of the control signals.

If the second clock signal (481) with the added slew target rate (654) is not delayed relative to the output of the calibration clock delay line (406), the method of FIG. 7 continues by storing (710), by the calibration controller (412), the values of the control signals as calibrated values in a slew rate control register. Storing (710), by the calibration controller (412), the values of the control signals as calibrated values in a slew rate control register may be carried out by transmitting the value to a control register in a physical layer core.

The method of FIG. 7 optionally also includes providing (712) the calibrated values (195) of the control signals to a multi-protocol driver (160-164). Providing (712) the calibrated values (195) of the control signals to a multi-protocol driver (160-164) may be carried out by transmitting the calibrated values to a particular multi-protocol driver.

Exemplary embodiments of the present invention are described largely in the context of a fully functional computer system for calibrating slew rate control signal values using a multi-protocol driver slew rate calibration system. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A multi-protocol driver slew rate calibration system for calibrating slew rate control signal values, the system comprising:
   a first phase rotator configured to generate a first clock signal by phase rotating a input reference signal by a first phase selector amount;
   a second phase rotator configured to generate a second clock signal by phase rotating the input reference signal by a second phase selector amount; and
   a calibration controller configured to:
   initially set the first delay phase amount and the second delay phase amount such that the first clock signal is delayed relative to the second clock signal;
   determine whether the first clock signal is delayed relative to the second clock signal;
   if the first clock signal is delayed relative to the second clock signal, change the second phase selector amount that the second phase rotator uses to phase rotate the input reference signal; and
   if the first clock signal is not delayed relative to the second clock signal, use the first clock signal and the second clock signal to calibrate values of control signals provided to control a slew rate of a calibration clock delay line such that the slew rate of the calibration clock delay line substantially matches a target slew rate.

2. The system of claim 1 further comprising a slew-early latch having an input coupled to an input of the calibration clock delay line and having an output coupled to a first input of the calibration controller; wherein the slew-early latch also includes a clock input configured to receive the second clock signal.

3. The system of claim 2 wherein determining whether the first clock signal is delayed relative to the second clock signal includes monitoring the output of the slew-early latch for a state change.

4. The system of claim 1 wherein using the first clock signal and the second clock signal to calibrate values of control signals provided to control a slew rate of a calibration clock delay line such that the slew rate of the clock delay line substantially matches a target slew rate includes the calibration controller:
- adding the slew target rate to the second clock signal;
- determining whether the second clock signal with the added slew target rate is delayed relative to the output of the calibration clock delay line;
- if the second clock signal with the added slew target rate is delayed relative to the output of the calibration clock delay line, changing the values of the control signals provided to the calibration clock delay line to change the slew rate of the calibration clock delay line; and
- if the second clock signal with the added slew target rate is not delayed relative to the output of the calibration clock delay line, storing the values of the control signals as calibrated values in a slew rate control register.

5. The system of claim 1 further comprising a slew-late latch having an input coupled to an output of the clock delay line and having an output coupled to a second input of the calibration controller; wherein the slew-late latch also includes a clock input configured to receive the second clock signal.

6. The system of claim 5 wherein determining whether the first clock signal is delayed relative to the second clock signal with the added target slew rate includes monitoring the output of the slew-late latch for a state change.

7. The system of claim 5 further comprising first comparator circuitry coupled between an output of the first phase rotator and an input of the clock delay line; and second comparator circuitry coupled between an output of the second phase rotator and a clock input of the slew-late latch.

8. The system of claim 7 wherein the first comparator circuitry and the second comparator circuitry are each configured to switch between a power saving mode and a calibration mode in response to receiving a calibration signal.

9. The system of claim 1 wherein the calibration controller is further configured to provide the calibrated values of the control signals to a multi-protocol driver, the multi-protocol driver configured to generate an output signal for a communication lane coupled between a memory module and a memory controller, the multi-protocol driver using the calibrated values of the control signal to control a slew rate of the driver clock delay line such that the slew rate of the driver clock delay line substantially matches the target slew rate.

10. The system of claim 9 wherein the multi-protocol driver is a multi-protocol double data rate (DDR) slew rate driver.

11. The system of claim 9 wherein the target slew rate corresponds to a particular driver lane setting of the multi-protocol driver.

12. A method of calibrating slew rate control signal values using a multi-protocol driver slew rate calibration system that includes a first phase rotator, a second phase rotator, and a calibration controller, the method comprising:
- generating, by the first phase rotator, a first clock signal by phase rotating an input reference signal by a first phase selector amount;
- generating, by the second phase rotator, a second clock signal by phase rotating the input reference signal by a second phase selector amount;
- initially setting, by the calibration controller, the first phase selector amount and the second phase selector amount such that the first clock signal is delayed relative to the second clock signal;
- determining, by the calibration controller, whether the first clock signal is delayed relative to the second clock signal;
- if the first clock signal is delayed relative to the second clock signal, changing, by the calibration controller, the second phase selector amount that the second phase rotator uses to phase rotate the input reference signal; and
- if the first clock signal is not delayed relative to the second clock signal, using, by the calibration controller, the first clock signal and the second clock signal to calibrate values of control signals provided to control a slew rate of a calibration clock delay line such that the slew rate of the calibration clock delay line substantially matches a target slew rate.

13. The method of claim 12 wherein the multi-protocol driver slew rate calibration system further comprises a slew-early latch having an input coupled to an input of the calibration clock delay line and having an output coupled to a first input of the calibration controller; wherein the slew-early latch also includes a clock input configured to receive the second clock signal.

14. The method of claim 13 wherein determining whether the first clock signal is delayed relative to the second clock signal includes monitoring the output of the slew-early latch for a state change.

15. The method of claim 12 wherein using the first clock signal and the second clock signal to calibrate values of control signals provided to control a slew rate of a calibration clock delay line such that the slew rate of the clock delay line substantially matches a target slew rate includes:
- adding the slew target rate to the second clock signal;
- determining whether the second clock signal with the added slew target rate is delayed relative to the output of the calibration clock delay line;
- if the second clock signal with the added slew target rate is delayed relative to the output of the calibration clock delay line, changing the values of the control signals provided to the calibration clock delay line to change the slew rate of the calibration clock delay line; and
- if the second clock signal with the added slew target rate is not delayed relative to the output of the calibration clock delay line, storing the values of the control signals as calibrated values in a slew rate control register.

16. The method of claim 12 wherein the multi-protocol driver slew rate calibration system further comprises a slew-late latch having an input coupled to an output of the clock delay line and having an output coupled to a second input of the calibration controller; wherein the slew-late latch also includes a clock input configured to receive the second clock signal.

17. The method of claim 16 wherein determining whether the first clock signal is delayed relative to the second clock signal with the added target slew rate includes monitoring the slew-late latch for a state change.

18. The method of claim 16 wherein the multi-protocol driver slew rate calibration system further comprises first comparator circuitry coupled between an output of the first phase rotator and an input of the clock delay line; and second comparator circuitry coupled between an output of the second phase rotator and a clock input of the slew-late latch.

19. The method of claim 18 wherein the first comparator circuitry and the second comparator circuitry are each configured to switch between a power saving mode and a calibration mode in response to receiving a calibration signal.

20. The method of claim 12 further comprising providing, by the calibration controller, the calibrated values of the control signals to a multi-protocol driver, the multi-protocol driver configured to generate an output signal for a communication lane coupled between a memory module and a memory controller, the multi-protocol driver including a driver clock delay line substantially similar to the calibration clock delay line, the multi-protocol driver using the calibrated values of the control signal to control a slew rate of the driver clock delay line such that the slew rate of the driver clock delay line substantially matches the target slew rate.

21. The method of claim 20 wherein the multi-protocol driver is a multi-protocol double data rate (DDR) slew rate driver.

22. The method of claim 20 wherein the target slew rate corresponds to a particular driver lane setting of the multi-protocol driver.

* * * * *